United States Patent [19]

Nishizawa

[11] Patent Number: 4,720,735
[45] Date of Patent: Jan. 19, 1988

[54] PHOTOTRANSISTOR HAVING A NON-HOMOGENEOUSLY BASE REGION

[76] Inventor: Jun-ichi Nishizawa, 6-16, Komegafukuro 1-chome, Sendai-shi, Miyagi 980, Japan

[21] Appl. No.: 903,890

[22] PCT Filed: Aug. 31, 1983

[86] PCT No.: PCT/JP83/00290
§ 371 Date: Apr. 30, 1984
§ 102(e) Date: Apr. 30, 1984

[87] PCT Pub. No.: WO84/01055
PCT Pub. Date: Mar. 15, 1984

Related U.S. Application Data

[63] Continuation of Ser. No. 610,301, Apr. 30, 1984, abandoned.

[30] Foreign Application Priority Data

Aug. 31, 1982 [JP] Japan .................................. 57-151950

[51] Int. Cl.⁴ .............................................. H01L 29/80
[52] U.S. Cl. ........................................ 357/22; 357/30; 357/20; 357/56; 357/58; 357/90
[58] Field of Search ........................ 357/30, 34, 51, 55, 357/90, 38, 38 LA, 58, 22 E, 22 LR, 22 G, 22 R, 22 V, 22, 20, 54, 56

[56] References Cited

U.S. PATENT DOCUMENTS

| | | | |
|---|---|---|---|
| 4,000,506 | 12/1976 | Hirai et al. | 357/34 |
| 4,151,540 | 4/1979 | Sander et al. | 357/34 |
| 4,178,190 | 12/1979 | Polinsky | 357/34 X |
| 4,295,058 | 10/1981 | Lade et al. | 357/38 X |
| 4,337,473 | 6/1982 | Nishizawa | 357/58 X |
| 4,377,029 | 3/1983 | Ozawa | 357/34 X |
| 4,381,953 | 5/1983 | Ho et al. | 357/34 X |
| 4,414,557 | 11/1983 | Amemiya et al. | 357/34 X |
| 4,427,990 | 1/1984 | Nishizawa | 357/30 X |

FOREIGN PATENT DOCUMENTS

| | | | |
|---|---|---|---|
| 0525273 | 1/1977 | Japan | 357/22 |
| 0005273 | 1/1977 | Japan | 357/34 |
| 53-124086 | 10/1978 | Japan | 357/38 |

OTHER PUBLICATIONS

Nishizawa et al., "Current Amplification in Non Homogeneous-Base Structure and Static Induction Transistor Structure," J. Appl. Phys., 57(10), 15 May 1985, pp. 4783-4797.

Primary Examiner—Andrew J. James
Assistant Examiner—William A. Mintel
Attorney, Agent, or Firm—McGlew and Tuttle

[57] ABSTRACT

In a phototransistor which comprises an emitter, a collector and a base, base portions 20 and 21 are made unequal in impurity density, by which minority carriers of optically excited carriers are stored in the high impurity density regions 20 of the base and majority carriers are permitted to easily pass through the low impurity sensity regions 21 of the base, and voltages of the high and low impurity density regions are coupled together. A very high-sensitivity and high-speed operation can be achieved.

3 Claims, 19 Drawing Figures

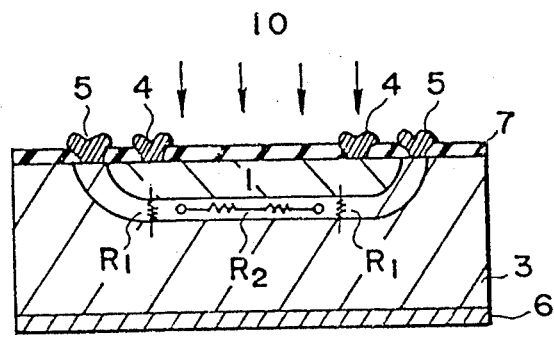
FIG. 1
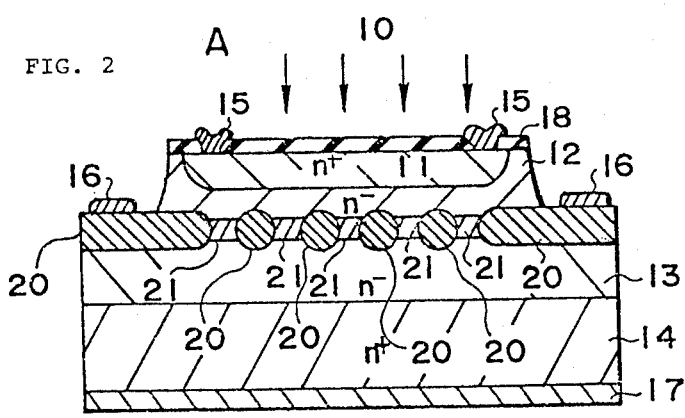
FIG. 2
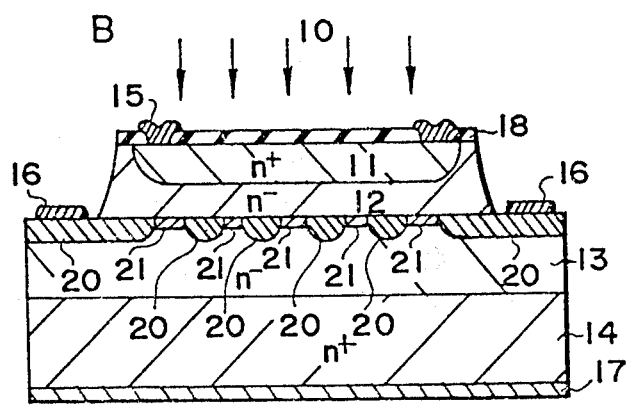

A

B

C

D

PHOTOTRANSISTOR HAVING A NON-HOMOGENEOUSLY BASE REGION

This application is a continuation, of application Ser. No. 610,301, filed Apr. 30, 1984, now abandoned.

TECHNICAL FIELD

The present invention relates to a high-speed and high-sensitivity semiconductor device and, more particularly, to a phototransistor having a nonhomogeneously doped impurity base region.

BACKGROUND OF THE INVENTION

Conventional p-n-p or n-p-n bipolar type phototransistors which have a uniform or gradually-graded base structure have defects of low sensitivity and low operating speed because of their high base resistance and large collector-base and emitter-base capacitances.

FIG. 1 shows an example of the conventional bipolar phototransistor, 4 being an emitter electrode, 1 an emitter region, 5 a base electrode, 2 a base region, 6 a collector electrode and 3 a collector region. 10 is a light input. The base electrode 5 may be made floating in some cases. 7 is an insulating material such as an SiO$_2$ film or the like.

As shown in FIG. 1, in the portion of the base region 2, the distributed base resistance R$_1$ between the emitter junction and the collector junction is high, because the emitter and collector are low in impurity density. Also, the distributed base lead-out resistance R$_2$ is high, because the base is low in impurity density and small in base thickness, and further, there are other parasitic resistances. Therefore, the value of the base resistance of the bipolar phototransistor, including these parasitic resistances, is very large.

The ratio of the density, $\Delta$In, of an amplified electron current flowing between the emitter and collector of the phototransistor of the n-p-n structure to the total current density I by incident light, that is, the current amplification factor, $\Delta$In/I, is given by the following equation in the case where the incident light intensity is very low and a dark current component is also small.

$$\frac{\Delta In}{I} = \frac{D_n L_p n_e}{D_p W_b P_b} \quad (1)$$

Here, $D_n$ and $D_p$ are diffusion coefficients of electrons and holes, $L_p$ is the diffusion length of holes, $W_b$ is the thickness of the base, $n_e$ is the impurity density of the emitter and $P_b$ is the impurity density of the base.

Eq. (1) is just the injection ratio of the emitter junction, $I_n/I_p$, and this means that the higher the injection ratio of the transistor is, the more its current amplification factor increases. $I_n$ is the total emitter current and $I_p$ a hole current.

To increase the current amplification factor of the conventional bipolar base phototransistor, it is required to raise the impurity concentration of the emitter region, and to reduce the impurity concentration of the base region and to decrease the thickness of the base region. However, the reduction of the impurity concentration and the thickness of the base region causes an increase in the parasitic base resistance. Therefore, this modification is not desirable.

Next, consider the operating speed of the phototransistor. The time constant for its rise and fall is given substantially by the following equation:

$$\tau \simeq \left\{ \exp\left( \frac{+\phi_{eb}}{KT} \right) \right\} \frac{W_b L_p}{D_p} \quad (2)$$

Here, $+\Phi_{eb}$ is the diffusion potential between the base and the emitter. The time constant decreases with a decrease in $L_p/D_p$, but the current amplification factor diminishes according to Eq. (1). A decrease in the thickness $W_b$ of the base will decrease the time constant and increase the current amplification factor. The value of $+\phi_{eb}$ is the diffusion potential which is dependent upon the impurity densities of the base and the emitter, and the reduction of this diffusion potential will cause a decrease in the time constant. Further, the value of $+\phi_{eb}$ decreases with a decrease in $n_e$ or $P_b$, but in order to prevent the reduction of the current amplification factor, it is necessary only to decrease $P_b$.

For the reasons given above, in order to raise the current amplification factor of such a conventional phototransistor of bipolar structure to speed up its operation, there is no choice but to decrease the thickness $W_b$ of the base to thereby reduce its impurity density. As described previously, however, this will increase the base resistance to impose limitations on the performance of the transistor, providing only very unsatisfactory results. At present, a p-i-n photodiode, an avalanche photodiode and so forth are widely used as photosensing elements, but the diode with two terminals is defective in that it is not sufficiently isolated from the succeeding stage. The avalanche photodiode calls for a relatively high voltage (several tens of volts) and has a serious drawback of some amount of avalanche multiplication noise.

Accordingly, the present invention has for its object the providing of a high-speed and high-sensitivity phototransistor which is free from the abovesaid defects.

SUMMARY OF THE INVENTION

The present invention is directed to a phototransistor which comprises an emitter, a collector and a base. The impurity concentration of the base region is made non-homogeneous in a plane perpendicular to a current flow between the emitter and collector. Photogenerated carriers, whose types of conductivity is the same as that of the base, are stored in the high impurity concentration regions of the base region. Majority carriers, which are injected from the emitter region, and photogenerated carriers, whose conductivity type is different from the abovesaid photogenerated carriers are permitted to easily pass through the low impurity concentration regions of the base region. The high and low impurity regions of the base region are made electrically capacitive-coupled together. With such an arrangement, the phototransistor of the present invention is able to perform a high-sensitivity and high-speed operation which is free from the drawbacks of the conventional bipolar phototransistor.

BRIEF DESCRIPTION OF THE DRAWINGS

FIG. 1 is a schematic cross-sectional view of a conventional bipolar phototransistor;

BEST MODE FOR CARRYING OUT THE INVENTION

Figure 2:
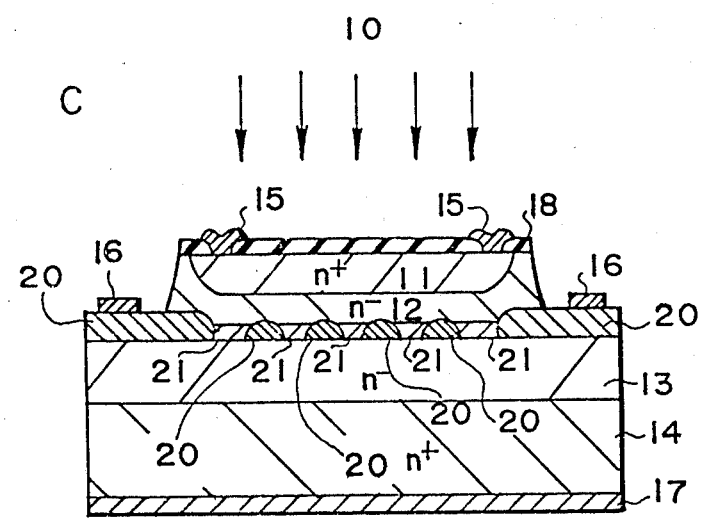
FIGS. 2A to D are diagrams showing the cross-sectional structures of embodiments of the present invention with various base structures.
Figure 2:
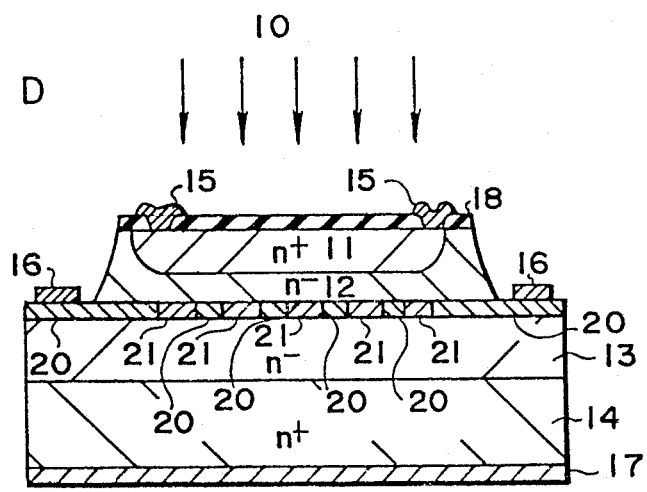

With reference to the drawings, the present invention will hereinafter be described in detail. To obtain a high-sensitivity and high-speed phototransistor, it is necessary to decrease the base resistance and the capacitance around the base.

The present invention utilizes, for the reduction of the base resistance, the fact that the base resistance can be decreased to a very low level by increasing the impurity density only in required regions of the base, instead of distributing its impurity density uniformly throughout it. Low impurity density regions of the base are made to facilitate the injection thereinto of monority carriers from the emitter. This can be achieved because the diffusion potential $\phi_{eb}$ between the abovesaid high impurity density regions of the base and the emitter is higher than the diffusion potential between the low impurity density regions of the base and the emitter region. The carrier injection efficiency of the emitter essentially rises without the injection of carriers into the emitter region from the low impurity density regions of the base. The two split base regions are capacitively connected to each other, reducing the effective base resistance.

Upon irradiation by light, holes of the resulting electronhole pairs are stored in the high impurity density base regions, and electrons pass through the low impurity density base regions and flow to the n region of the collector. The holes charge the high impurity density base regions positive to lower the diffusion potential $\phi_{eb}$ between the base and emitter by $\Delta V_{eb}$, facilitating the flowing of many free electrons from the emitter into the low impurity density base regions. In consequence, as is evident from Eq. (1), the current amplification factor by light increases to a very high level as compared with that obtainable with an ordinary bipolar phototransistor.

FIG. 2A illustrates an embodiment of a semiconductor device which is the phototransistor of the present invention. A description will be given first of its structure. Reference numeral 11 indicates an n-type high impurity density emitter region, 12 an n-type relatively low impurity density emitter region, 13 an n-type relatively low impurity density collector region, 14 an n-type relatively high impurity density collector region, 15 an emitter electrode, 17 a collector electrode and 18 a surface protective film, which is an insulating film as of $SiO_2$.

Reference numeral 16 designates a base electrode. The base region is a region defined between the emitter and the collector and is comprised of p-type high impurity density regions 20 and p-type low impurity density regions 21, and the geometrical configuration of the high impurity density regions 20 is larger than that of the low impurity density regions 21.

A description will be given of the operation of this transistor. With the provision of such a base region, as described previously, when the optical input 10 is applied, the holes are stored in the high impurity density base regions 20 and the electrons are injected from the emitter through the relatively low impurity density regions 21 to thereby increase the current amplification factor for light, and the presence of the high impurity density base regions 20 makes the base resistance much lower than in the case where the base is formed only by the low impurity density regions 21, so that the switching time also becomes very short. Further, since the relatively low impurity density regions are inserted between the emitter and the base and between the base and collector, the capacitance between the emitter and the base and the capacitance between the base and the collector decrease, contributing to the further enhancement of the switching characteristic.

As described above, according to the present invention, the base resistance is reduced, the injection efficiency from the emitter is high and the capacitances between the base and the emitter and between the base and the collector are small; therefore, a high-sensitivity and high-speed phototransistor can be achieved.

FIGS. 2B to D illustrate other embodiments, in which the bases have modified shapes. In FIG. 2B the base-emitter junction is flat and the p+ regions 20 of the base are formed to project out towards the base-collector junction. In FIG. 2C the p+ regions 20 are formed to project out towards the emitter unlike in FIG. 2B. FIG. 2D shows an example in which the base is formed to the same thickness.

The phototransistor shown in FIG. 2A is fabricated in the following manner: The n− layer 13 having an impurity density of $10^{12}$ to $10^{16}$ cm$^{-3}$ is epitaxially grown 10 μm thick by a vapor growth method through using $SiCl_4$ and $H_2$ gas. Next, the $SiO_2$ film 18 is formed on the epitaxial layer, and by the diffusion of boron through a mask, the p+ regions 20 having a high impurity density exceeding $10^{19}$ cm$^{-3}$ are formed to a depth of 1 μm. The epitaxial growth is carried out again, thereby growing the n-type high resistivity layer 12 of substantially the same resistivity as that of the region 13 to a thickness of about 3 μm. During the epitaxial growth the low impurity density p layers 21 are formed. The high impurity density n+ layer 11 of the emitter, which has a value larger than $10^{19}$, is formed by diffusing phosphorus through a selective diffusion method with the $SiO_2$ film. Next, chemical etching is performed down to the p+ regions 20 of the base, exposing the p+ base regions 20. The electrode regions of the base and the emitter are exposed by oxidation and a mask method, and then aluminum is vapor-deposited on both sides of the substrate assembly in a high vacuum. The top surface is subjected to selective etching to form the emitter and base electrodes. The bottom surface serves as the collector electrode.

To prevent the occurrence of lattice distortions in the P+ regions 20 of the base and then n+ region 11 of the emitter, it is desirable to adopt a method which adds the Group IV elements, such as, for example, germanium or tin. If the carrier life is short, the rate of the carriers reaching the collector from the emitter drops, so that it is necessary to minimize the mixing of a heavy metal which acts as a carrier killer, and it is preferable to effect gettering of heavy metals at the final stage of the manufacturing process. The formation of the P+ layer of the base can be accomplished by an ion implantation method, or a method using boron-doped polycrystalline silicon as a diffusion source.

FIGS. 3A to C illustrate other embodiments of the present invention. In these embodiments the low impurity density region of the base is formed by a high resistivity P− region so as to raise the injection efficiency from the emitter.

Reference numeral 20 indicates an n+ collector region (exceeding $1 \times 10^{18}$ cm$^{-3}$), 21 a P− base region of a low impurity density ($10^{12}$ to $10^{16}$ cm$^{-3}$), 22 high impurity density (higher than $1 \times 10^{19}$ cm$^{-3}$) P+ regions of the base, 23 n+ emitter regions (higher than $1 \times 10^{19}$ cm$^{-3}$) and 24, 25 and 26 emitter, base and collector electrodes, respectively. Reference numeral 27 in FIG. 3A to FIG. 3C indicates SiO$_2$ film. In order to reduce the base resistance, the base electrodes are interconnected.

FIG. 3B shows an embodiment of a structure in which etching is effected down to the high impurity density P+ regions of the base for the purposes of raising the breakdown voltage between the base and the emitter, decreasing the capacitance between the emitter and the base and increasing the area of irradiation by light. The etching down to the p+ base regions can be accomplished by chemical etching, chemical etching utilizing the anisotropy of crystals, a method using silicon nitride and oxide films, or plasma etching.

FIG. 3C is a top plan view of a phototransistor assembly in which a number of such phototransistors of the embodiment shown in FIG. 3A or B are arranged and in which the base and emitter electrodes are each formed in a comb-shaped interdigitated pattern.

Figure 4:
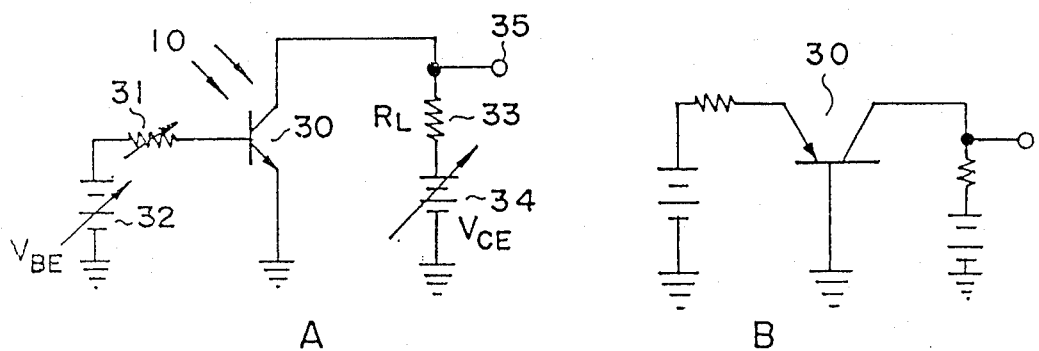
FIGS. 4A and B show examples of operation circuits of embodiments of the present invention which employ a common emitter and a common base, respectively.

FIGS. 4A and B shows, by way of example, how to use the phototransistor of the present invention, A being a common emitter structure and B a common base structure.

Figure 3:
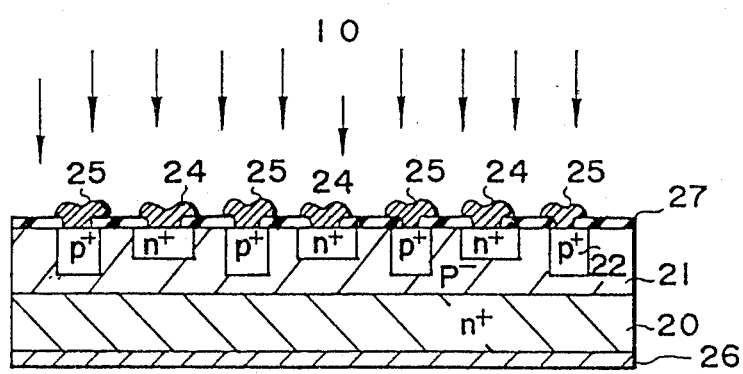
FIGS. 3A to C illustrate other embodiments of the present invention.
Figure 3:
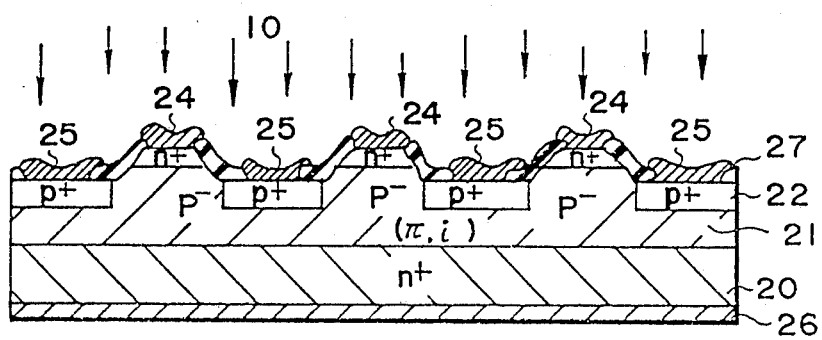
Figure 3:
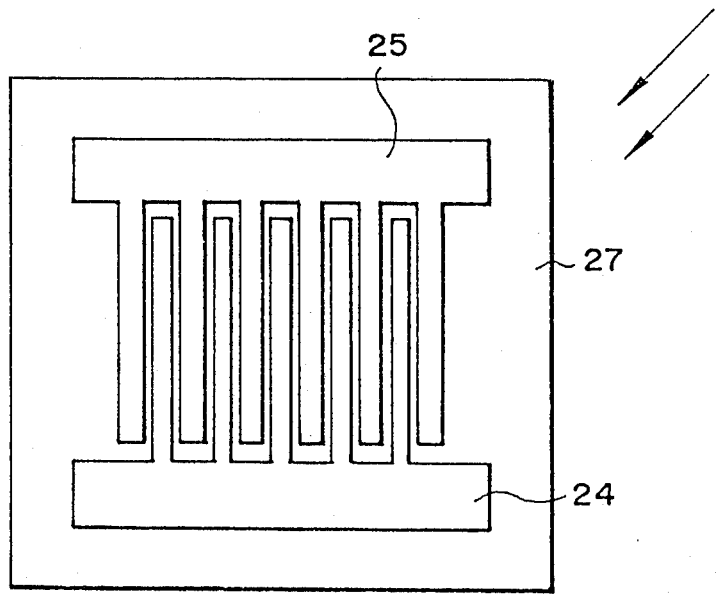

Reference numeral 30 identifies the phototransistor shown in FIG. 2 or 3, 31 a variable external base resistor connected to the base electrode, 32 a base-emitter power source, 33 a load resistor $R_L$ of the collector, 34 a collector-emitter power source, 35 an output terminal and 10 an optical input.

By virtue of its structure which minimizes the base resistance, the phototransistor of the present invention permits adjustment of its effective base resistance over a very wide range through the variable base resistor 31 connected to the base electrode and, consequently, possesses that feature of setting the value of variable base resistor 31 in accordance with a request from a photodetector circuit which is unobtainable with the conventional bipolar phototransistor. FIG. 4B shows an example which employs a common base structure in contrast to a common emitter structure as shown in FIG. 4A.

Figure 5:
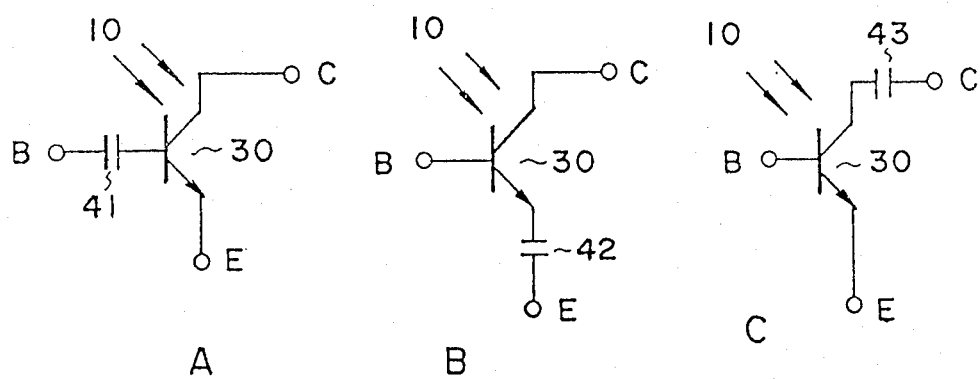
FIGS. 5A to C illustrate examples of operation circuits of embodiments of the phototransistor of the present invention in which a capacitor is connected to the base, the emitter and the collector, respectively.

FIGS. 5A, B and C illustrate embodiments of the phototransistor of the present invention in which capacitors are connected to the base, emitter and collector electrodes, respectively. By connecting capacitors 41, 42 and 43 to the respective electrodes of the phototransistor 30, it is possible with the phototransistor of the present invention to store an optical signal resulting from the optical input 10 in the capacitor connected to each electrode. It is needless to say that the phototransistors of the embodiments of FIG. 5, which are equipped with such a function, can be applied to a one transistor/one pixel type random access image sensor for optical information and various other image sensors having an optical information storage function.

Figure 6:
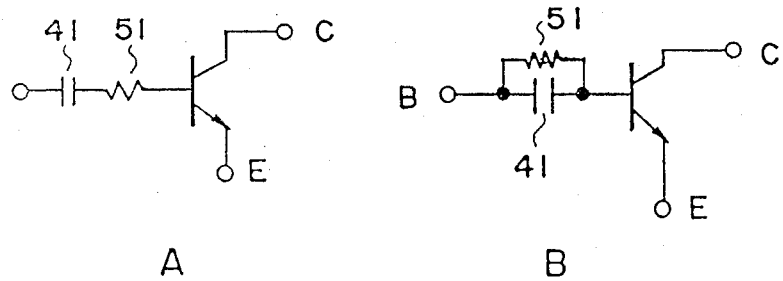
FIGS. 6A and B show examples of operation circuits in which a series and a parallel circuit of a capacitor and a resistor are connected to the base electrode from the outside, respectively, to provide for increased function.

FIGS. 6A and B illustrate embodiments of the phototransistor of the present invention in which a capacitor 41 and a resistor 51 are connected to the base. The CR time constant of the base by the capacitor 41 and the resistor 51 provides for extended function of the phototransistor.

Figure 7:
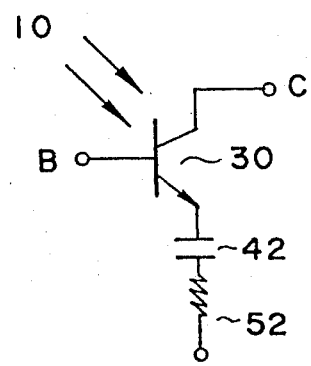
FIGS. 7A to D show operation circuits in which a series and a parallel circuit of a resistor and a capacitor are connected to the emitter and the collector from the outside, respectively.
Figure 7:
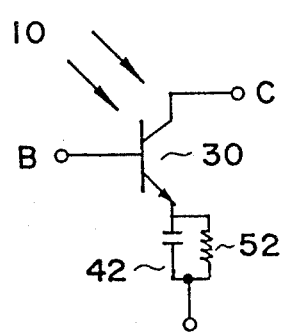
Figure 7:
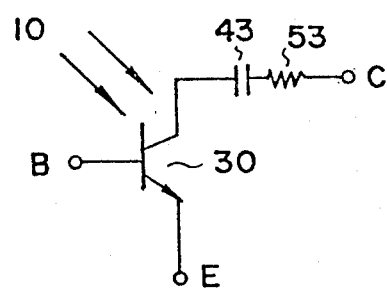
Figure 7:
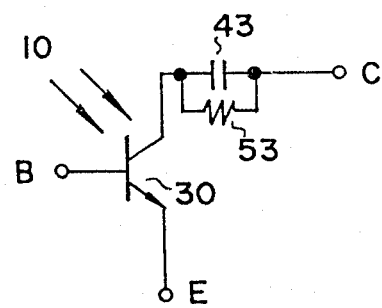

In the same way, FIG. 7A and FIG. 7B illustrate other embodiments of the phototransistor of the present invention in which a capacitor 42 and a resistor 52 are connected to the emitter. In the same way, FIG. 7C and FIG. 7D illustrate other embodiments of the phototransistor of the present invention in which a capacitor 43 and a resistor 53 are connected to the collector.

It is a matter of course that the phototransistor of the present invention can be formed to have a $p^+ - p^- - n^+ - n^- - p^+$ structure which is reverse in conductivity from the aforementioned one.

The material for the phototransistor of the present invention is not limited specifically to silicon but may also be germanium, of GaAs, GaP, AlAs and InP which are the Group III-V compound semiconductors, of $Ga_{1-x}AlAs$ and the like which are mixed crystals thereof, or the Group II-VI compound semiconductors.

AVAILABILITY FOR INDUSTRIAL USE

By virtue of its structure, the phototransistor of the present invention permits minimization of its base resistance to thereby raise the carrier injection efficiency from the emitter into the collector through the base and, consequently, it is able to perform a high-sensitivity and high-speed operation unobtainable in the past; therefore, the phototransistor or the invention takes the place of the conventional phototransistor and is further available for wide industrial applications.

I claim:

1. A phototransistor comprising a semiconductor substrate having a first surface and another surface opposite to the first surface and including an emitter electrode, a collector electrode and a base electrode, and an emitter region, a collector region, and a base region having an impurity concentration distribution, and wherein the distribution profile of the impurity concentration in the base region is nonhomogeneous in a base plane perpendicular to a current flow direction between the emitter region and collector region and includes high and low impurity concentration region portions, the base region having a first conductivity type and the emitter region and collector region both having a second conductivity type which is the reverse of the first conductivity type of the base region, photogenerated carriers whose type of conductivity is the same as that of the nonhomogeneous base region are stored in the high impurity concentration region portions of the base region, majority carriers which are injected from the emitter region and photogenerated carriers whose conductivity type is different from the former mentioned photogenerated carriers are permitted to easily pass through the low impurity concentration region portions of the base region, the high and low impurity concentration region portions of the base region are electrically capacitive-coupled together;

The current flow between the emitter region and collector region is controlled by the potential barrier-height relative to the emitter region in the low impurity concentration region portions of the base region, the height of which is capacitively controlled by the potential relative to the emitter region of the high impurity concentration region portions of the base region;

The thickness in the direction from the emitter region towards the collector region of the high impurity concentration region portions of the base region is no less than that of the low impurity concentration region portions of the base region in the same direction so that no neutral region is formed;

The emitter region and the collector region have low impurity concentration region portions formed in the vicinity of the base region which are reverse in conductivity type from that of the base region, and the emitter region is formed in the first surface of the semi-conductor substrate and the collector region is formed in the other surface of the semi-conductor substrate opposite to the first surface and the base region being divided into alternating high and low impurity concentration region portions across a space between the first and the other surface and being buried in the semi-conductor substrate, and the base electrode is contacted on a peripheral high impurity concentration region portion of the base region.

2. A phototransistor comprising a semi-conductor substrate having a first surface and another surface opposite to the first surface and including an emitter electrode, a collector electrode and a base electrode, and an emitter region, a collector region and a base region having an impurity concentration distribution, and wherein the distribution profile of the impurity concentration in the base region is nonhomogeneous in a base plane perpendicular to a current flow direction between the emitter region and collector region and includes low and high impurity concentration region portions, the base region having a first conductivity type and the emitter region and collector region both having a second conductivity type which is the reverse of the first conductivity type of the base region, photogenerated carriers whose type of conductivity is the same as that of the base region are stored in the high impurity concentration region portions of the base region, majority carriers which are injected from the emitter region and photogenerated carriers whose conductivity type is different from the former mentioned photogenerated carriers are permitted to easily pass through the low impurity concentration region portions of the base region, the high and low impurity concentration region portions of the base region are electrically capacitive-coupled together;

The current flow between the emitter region and collector region is controlled by the potential barrier-height relative to the emitter region in the low impurity concentration region portions of the base region, the height of which is capacitively controlled by the potential relative to the emitter region of the high impurity concentration region portions of the base region so that no neutral region is formed; and The emitter region is formed in the first surface of the semi-conductor substrate and connected to the low impurity concentration region portions of the base region at a first junction, and the collector region is formed in the other surface of the semi-conductor substrate and connected to the low impurity concentration region portions of the base region at a second junction, the low impurity concentration region portions of the base region are connected together and the high impurity concentration region portions of the base region are intermixed with the low impurity concentration region portions of the base region, the high impurity region portions of the base region being diffused in and spaced along below impurity concentration region portions of the base region, and a base electrode connected to each high impurity concentration region portion of the base region with all of the base electrode being connected together.

3. The phototransistor of claim 2, wherein the high impurity concentration region portions of the base region are formed in a recessed surface of the semi-conductor substrate near the first junction.

* * * * *